United States Patent
Oowada et al.

(10) Patent No.: US 6,787,293 B2
(45) Date of Patent: Sep. 7, 2004

(54) PHOTORESIST RESIDUE REMOVER COMPOSITION

(75) Inventors: Takuo Oowada, Soka (JP); Norio Ishikawa, Kasukabe (JP); Hidemitsu Aoki, Kanagawa (JP); Kenichi Nakabeppu, Kanagawa (JP); Yoshiko Kasama, Kanagawa (JP)

(73) Assignees: Kanto Kagaku Kabushiki Kaisha, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/395,649

(22) Filed: Mar. 21, 2003

(65) Prior Publication Data

US 2004/0002020 A1 Jan. 1, 2004

(30) Foreign Application Priority Data

Mar. 22, 2002 (JP) ........................................ 2002-081002

(51) Int. Cl.$^7$ ............................ G03F 7/42; C11D 17/04
(52) U.S. Cl. ........................ 430/329; 430/331; 510/175; 510/176; 510/257; 510/258
(58) Field of Search ................................ 430/329, 331; 510/175, 176, 257, 258

(56) References Cited

U.S. PATENT DOCUMENTS

| | | | |
|---|---|---|---|
| 5,334,332 A | 8/1994 | Lee | 252/548 |
| 5,480,585 A | 1/1996 | Shiotsu et al. | 252/544 |
| 5,567,574 A | 10/1996 | Hasemi et al. | 430/331 |
| 6,231,677 B1 | 5/2001 | Ishikawa et al. | 134/3 |
| 6,627,587 B2 * | 9/2003 | Naghshineh et al. | 510/175 |

FOREIGN PATENT DOCUMENTS

| | | |
|---|---|---|
| EP | 662 705 A2 | 12/1994 |
| EP | 1 091 254 A2 | 11/2001 |
| GB | 2 354 086 A | 3/2001 |
| JP | 5-281753 | 10/1993 |
| JP | 7-201794 | 8/1995 |
| JP | 8-262746 | 10/1996 |
| JP | 11-316464 | 11/1999 |
| JP | 2000162788 A | 6/2000 |
| JP | 2001022095 A | 1/2001 |
| JP | 2001022096 A | 1/2001 |
| JP | 2001-83712 | 3/2001 |
| JP | 2001-005200 | 12/2001 |

* cited by examiner

*Primary Examiner*—Richard L. Schilling
(74) *Attorney, Agent, or Firm*—Licata & Tyrrell P.C.

(57) ABSTRACT

A photoresist residue remover composition is provided that includes one type or two or more types of fluoride compound and one type or two or more types chosen from the group consisting of glyoxylic acid, ascorbic acid, glucose, fructose, lactose, and mannose (but excluding one that includes ammonium fluoride, a polar organic solvent, water, and ascorbic acid). There is also provided use of the photoresist residue remover composition for removing a photoresist residue and a sidewall polymer remaining after dry etching and after ashing.

6 Claims, 1 Drawing Sheet

DEPOSITS ON SIDEWALL AND BASE

INTERLAYER FILM

Ta/TaN

SIDE SLIT (Cu DISSOLVED)

INTERLAYER FILM

Ta/TaN

PHOTORESIST RESIDUE REMOVER COMPOSITION

This application claims the benefit of priority from Japanese Patent Application No. 2002-81002 filed on Mar. 22, 2002, herein incorporated by reference in its entirety.

BACKGROUND OF THE INVENTION

1. Field of the Invention

The present invention relates to a photoresist residue remover composition and, in particular, it relates to a photoresist residue remover composition for removing a photoresist residue after dry etching an interlayer insulating film material, a wiring material, a capacitor, or an electrode material in the production of a semiconductor circuit device.

2. Description of the Related Art

Dry etching is the most important technique used for pattern formation of an interlayer insulating film material, a wiring material, etc. in a production process for a semiconductor circuit device.

Dry etching is a technique that involves forming a pattern by applying a photoresist to a substrate on which a film of an interlayer insulating film material, a wiring material, etc. has been formed by sputtering, CVD, electroplating, spin coating, etc., exposing the photoresist to light and developing it, and then forming an interlayer insulating film pattern or a wiring pattern by dry etching with a reactive gas using the photoresist as a mask. The dry etched substrate is subjected to an ashing treatment in which the photoresist used as the mask is incinerated and removed, and after that a partially remaining photoresist residue, etc. is usually removed with a photoresist stripper.

The photoresist residue referred to here means all of an incompletely incinerated photoresist residue remaining after ashing on the surface of a substrate; a sidewall polymer (also called a sidewall protecting film or rabbit ears) remaining on the sidewall of wiring or a via hole; and an organometallic polymer and a metal oxide remaining on the sidewall and the base of the via hole. The photoresist residue remaining after the dry etching cannot be completely removed by a conventional photoresist stripper containing a combination of an organic solvent and an alkanolamine (for example, JP, A, 5-281753, U.S. Pat. No. 5,480,585). It is conceivable that this is because a part of the photoresist residue after ashing is mineralized together with an etched material such as a wiring material. Therefore, photoresist residue removers containing a fluoride compound (JP, A, 7-201794, EP, A, 662705), a hydroxylamine (U.S. Pat. No. 5,334,332), etc. have been proposed as techniques for removing the photoresist residue remaining after dry etching.

However, these photoresist residue removers require rinsing with an organic solvent such as isopropyl alcohol in order to prevent corrosion of the wiring material and also require a treatment at high temperature in order to completely remove the photoresist residue. Furthermore, since the photoresist residue has a similar composition to that of the wiring material, when treating substrates with these photoresist residue removers there is the problem of corrosion of the wiring material. Because of this, a remover containing a sugar alcohol such as sorbitol as a corrosion inhibitor for the wiring material, etc. (JP, A, 8-262746; U.S. Pat. No. 5,567,574) has been proposed. However, these photoresist residue removers contain an organic compound at a proportion of 50% or more, thus imposing a large burden on the environment, which is undesirable.

Moreover, accompanying the finer structure and higher performance of semiconductor circuit devices in recent years, new wiring materials and new interlayer insulating film materials are being used, and the use, without modification, of conventional photoresist residue removers is approaching its limit.

For example, in order to reduce the wiring resistance so as to fulfill the requirements for finer structure and higher speed of semiconductor circuit devices, copper wiring has been investigated, and it has become possible to form copper wiring by a damascene process. The damascene process is a process in which a wiring pattern is formed as trenches on an interlayer insulating film, copper is embedded by sputtering or electroplating, and unwanted blanket copper is removed using chemical-mechanical polishing (CMP), etc. to form a wiring pattern.

With regard to a resist stripper for this new copper wiring material, there are resist strippers containing a triazole compound, etc. as a corrosion inhibitor for copper (JP, A, 2001-22095, JP, A, 2001-22096, JP, A, 2000-162788), but these resist strippers require a high temperature treatment and rinsing with isopropyl alcohol, etc. as in the above-mentioned photoresist residue removers, and there is the further problem that they contain an organic solvent. Moreover, there is a resist stripper composition containing a benzotriazole derivative as a corrosion inhibitor for copper (JP, A, 2001-83712), and this also contains a water-soluble organic solvent and has the above-mentioned problems. Furthermore, problems of the triazole compound and the benzotriazole derivative having poor biodegradability and imposing a large burden on waste treatment can be cited. Moreover, since the triazole compound and the benzotriazole derivative are poorly water-soluble, these corrosion inhibitors remain on the surface of a wafer after rinsing it with water, thus causing the problem of adverse effects on subsequent steps in some cases.

Similarly, in order to reduce the capacitance between wiring so as to fulfill the demands for finer structure and higher speed of semiconductor circuit devices, a low permittivity interlayer insulating film (the so-called low-k film) has been investigated in recent years. In general, low-k films are organic films such as aromatic aryl compounds, siloxane films such as HSQ (Hydrogen Silsesquioxane) and MSQ (Methyl Silsesquioxane), porous silica films, etc. In the case where a semiconductor circuit device is produced using such a wiring material or interlayer insulating film material, dry etching of the interlayer insulating film material or the various types of low-k film is carried out when forming an upper wiring trench or a via hole providing a connection between lower copper wiring and upper wiring, and at this point a photoresist residue is formed that has a different composition from that formed when using the conventional wiring material and interlayer insulating film material.

Furthermore, since copper and the various types of low-k film have poorer chemical resistance than the conventional wiring material and interlayer insulating film material, a conventional aluminum wiring photoresist residue remover cannot be used without modification when removing the photoresist residue remaining after dry etching. For example, an alkanolamine and a quaternary ammonium compound present in the above photoresist residue remover cause corrosion of copper, which has poor corrosion resistance and, furthermore, cause the film thickness of the various types of low-k film to decrease, and the structure, permittivity, mechanical strength, etc. thereof to change.

A neutral or acidic liquid causes less damage to the low-k film than does an alkaline liquid, and it is thought to be a promising photoresist residue removal component. With regard to neutral or acidic photoresist residue removers, one containing ammonium fluoride, a polar organic solvent, water and ascorbic acid has been proposed in JP, A, 2001-005200. However, the main target of this remover is aluminum wiring material, and a low-k film containing silicon such as a siloxane film or a porous silica film might be noticeably etched in some cases. A remover containing an organic acid has also been proposed (JP, A, 11-316464, U.S. Pat. No. 6,231,677 B1). However, removers containing an organic acid might not be able to satisfactorily remove a photoresist residue remaining on a substrate after ashing. Furthermore, those containing an organic acid generate micro corrosion defects of copper in the vicinity of an interface between the copper and a barrier metal such as Ta or TaN, and these defects become apparent as the device structure becomes finer, thus causing the problem that the reliability of the device is affected. These corrosion defects are called side slits (see FIG. 1).

As hereinbefore described, although various types of photoresist residue removers suitable for conventional wiring materials and interlayer insulating film materials have been obtained, the current situation is that a photoresist residue remover composition that can simultaneously satisfy the above-mentioned needs for semiconductor substrates using new materials has not yet been obtained.

SUMMARY OF THE INVENTION

It is therefore an object of the present invention to provide a photoresist residue remover composition that has excellent properties for removing a photoresist residue remaining after dry etching in a production process for a semiconductor circuit device and that does not cause any damage to new wiring materials, new interlayer insulating films, etc.

That is, specifically, the object of the present invention is to provide a photoresist residue remover composition that can suppress corrosion of copper or a copper alloy, including side slits, which are micro corrosion defects of copper in the vicinity of an interface between the copper and a barrier metal such as Ta or TaN, that can also prevent the film thickness of various types of low-k film from decreasing and the structure, permittivity, and mechanical strength thereof from changing, and that has excellent photoresist residue removal properties.

As a result of an intensive investigation by the present inventors in order to solve the above-mentioned problems it has been found that combining a fluoride compound, which causes little corrosion of copper, as a photoresist residue removal component with a specific compound as a component that mainly prevents corrosion can not only prevent corrosion of a wiring material and a low-k film but can also surprisingly suppress the occurrence of side slits, and the present invention has thus been accomplished (see FIG. 2).

That is, the present invention relates to a photoresist residue remover composition that includes one type or two or more types of fluoride compound, and one type or two or more types chosen from the group consisting of glyoxylic acid, ascorbic acid, glucose, fructose, lactose, and mannose (but excluding one that includes ammonium fluoride, a polar organic solvent, water, and ascorbic acid).

Furthermore, the present invention relates to the photoresist residue remover composition wherein the fluoride compound is ammonium fluoride.

Moreover, the present invention relates to the photoresist residue remover composition wherein the concentration of glyoxylic acid, ascorbic acid, glucose, fructose, lactose, and mannose used is 0.01 to 5.0 wt % of the entire composition.

Furthermore, the present invention relates to the photoresist residue remover composition wherein it further includes a surfactant.

Moreover, the present invention relates to the photoresist residue remover composition wherein it is used for a substrate having one type or two or more types chosen from the group consisting of copper, a copper alloy, and a low permittivity (low-k) film.

Furthermore, the present invention relates to the photoresist residue remover composition wherein it contains no polar organic solvent.

Moreover, the present invention relates to use of the photoresist residue remover composition for removing a photoresist residue and a sidewall polymer remaining after dry etching and after ashing.

Since the photoresist residue remover composition of the present invention contains a fluoride compound and the above-mentioned specific compound, it has excellent photoresist residue removal properties and does not cause any damage to wiring materials such as copper and aluminum, interlayer insulating films, etc. Furthermore, copper, which is a new material and has poor chemical resistance, is not corroded and, moreover, the interface between the copper and a barrier metal such as Ta or TaN formed when embedding copper by the damascene process is not corroded, that is, the occurrence of side slits can also be suppressed. In the case where the composition is used for a low-k film, it does not cause a decrease in the film thickness and changes in structure, permittivity, mechanical strength, etc.

Furthermore, in the case where no organic solvent is used, the burden on the environment is small.

MODES FOR CARRYING OUT THE INVENTION

Figure 1:
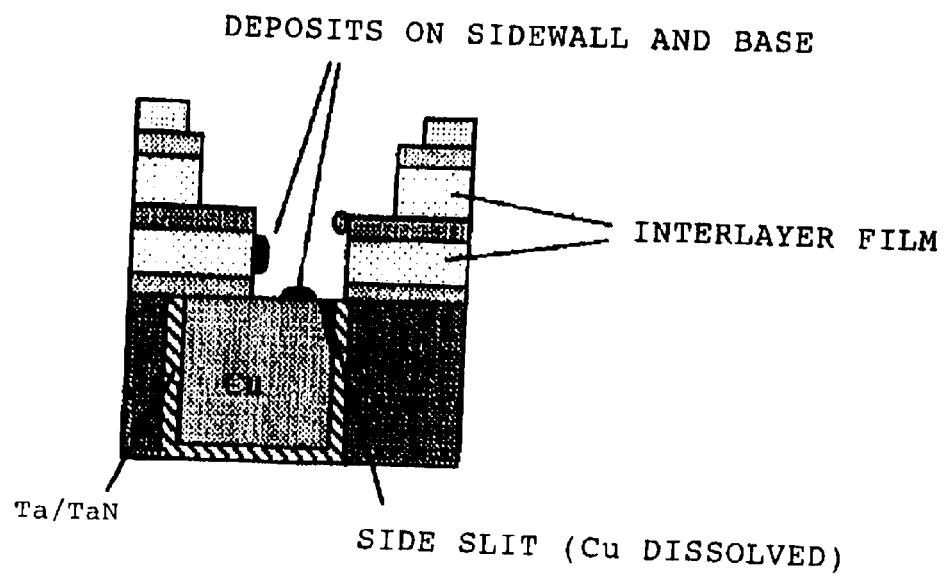
FIG. 1 shows a case where a conventional photoresist residue remover containing an organic acid was used. Removal of the residue was incomplete and corrosion of copper (side slit) occurred.
Figure 2:
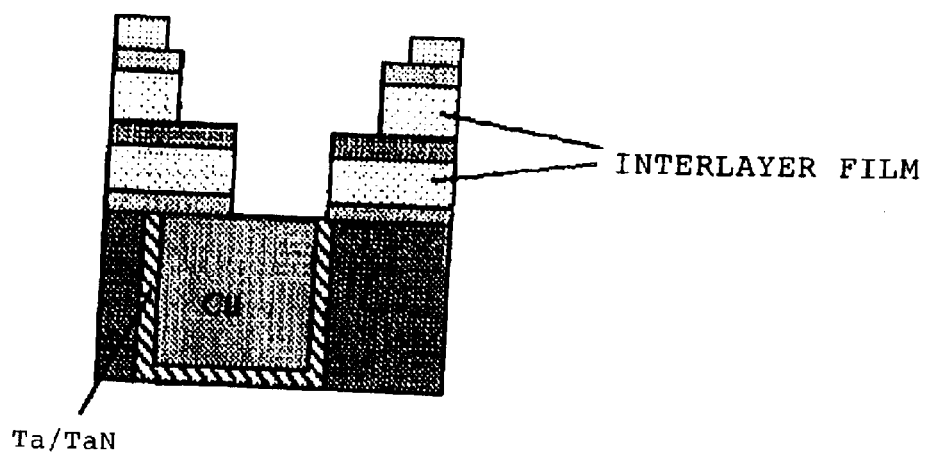
FIG. 2 shows a case where the photoresist residue remover of the present invention was used. Residue was removed without causing corrosion of copper (side slit).

The fluoride compound used in the photoresist residue remover composition of the present invention is an ammonium fluoride or a hydrogen fluoride salt of an amine. Examples thereof include ammonium fluoride, acidic ammonium fluoride, methylamine hydrogenfluoride, ethylamine hydrogenfluoride, propylamine hydrogenfluoride, tetramethylammonium fluoride, tetraethylammonium fluoride, ethanolamine hydrogenfluoride, methylethanolamine hydrogenfluoride, dimethylethanolamine hydrogenfluoride, and triethylenendiamine hydrogenfluoride. Among these compounds, it is preferable to use ammonium fluoride, which has a high photoresist residue removal power and a low metallic impurity content, and is easily available.

The composition of the photoresist residue remaining after ashing varies depending on the material on which dry etching is carried out. In the case where an interlayer insulating film, etc. on copper wiring is subjected to dry etching, the photoresist residue present on the surface of a substrate, or the base or the sidewall of a via hole after ashing includes copper oxide and reaction products formed from a mixture of the photoresist, the interlayer insulating film, a dry etching gas, etc. This photoresist residue can be removed with an alkanolamine, a quaternary ammonium compound, an aliphatic polycarboxylic acid or salt thereof, or a fluoride compound, but the alkanolamine and the quaternary ammonium compound cause a decrease in the film thickness and cause changes in the structure, the permittivity, the mechanical strength, etc. of the various types of low-k films. Therefore, the fluoride compound can be cited as the most suitable component for removing the photoresist residue while causing no damage to the copper and the low-k film, and the fluoride compound can be used by appropriately choosing an optimum concentration.

The glyoxylic acid, ascorbic acid, glucose, fructose, lactose, and mannose used in the photoresist residue remover composition of the present invention function as a corrosion inhibitor for copper and aluminum. The conventional photoresist residue remover contains a photoresist residue removal component such as a fluoride compound, a water-soluble amine compound, or an aliphatic polycarboxylic acid; a corrosion inhibitor such as a sugar alcohol, for example, sorbitol, an aromatic hydroxy compound, for example, catechol, or an aromatic nitrogen-containing compound, for example, benzotriazole; and water. It is conceivable that these corrosion inhibitors form a coating of an insoluble chelating compound on the copper surface, thus preventing the photoresist removal component from coming into contact with metal and thereby exhibiting an effect in preventing the corrosion thereof.

Since glyoxylic acid, ascorbic acid, glucose, fructose, lactose, and mannose used in the photoresist residue remover composition of the present invention are reducing materials, it is conceivable that controlling the redox potential of the remover can control electron transfer between the remover and various types of metals, thus preventing the corrosion thereof. Corrosion of a metal in aqueous solution is affected by the pH, the redox potential, the temperature, whether or not there is a chelating agent, and other metals present in the aqueous solution, and the pH and the redox potential of the solution are important factors thereamong. It is conceivable that controlling these factors can prevent corrosion of metals in the aqueous solution.

The photoresist residue remover composition of the present invention, which contains a fluoride compound and at least one of glyoxylic acid, ascorbic acid, glucose, fructose, lactose, and mannose, has excellent properties for removing oxides of copper, etc. and reaction products formed from a mixture of photoresist, interlayer insulating film, a dry etching gas, etc., and as described above controlling the redox potential can minimize the corrosion of copper wiring and damage to the various types of low-k films.

Among glyoxylic acid, ascorbic acid, glucose, fructose, lactose, and mannose, glyoxylic acid is particularly preferable since it has a large effect on the redox potential and is stable in aqueous solution. The photoresist residue remover composition of the present invention, which contains a fluoride compound and at least one chosen from the group consisting of glyoxylic acid, ascorbic acid, glucose, fructose, lactose, and mannose, can remove a photoresist residue even if the composition does not contain an organic solvent, particularly a polar organic solvent, causes no damage to copper and various types of low-k films, and is advantageous from the viewpoint of it having a low burden on the environment.

The concentration of the fluoride compound is determined appropriately according to the removal target, but it is preferably 0.05 to 1 wt % relative to the entire composition, and particularly preferably 0.1 to 0.4 wt %. When the concentration is too low, the removal power is low, and when it is too high, corrosion might be caused on wiring materials and low-k films of various types.

Glyoxylic acid, ascorbic acid, glucose, fructose, lactose, and mannose are used in order to prevent corrosion of the metal used as a wiring material, etc., and the concentration thereof used is determined from the viewpoint of the photoresist residue removal performance, the power to prevent damage to the wiring material and the interlayer insulating film material, the cost, and the presence of precipitates and crystals, and is preferably 0.01 to 5 wt %, and more preferably 0.03 to 0.3 wt %.

Furthermore, in the present invention a surfactant can be further added to the photoresist residue remover in order to impart thereto an affinity for a water-repellent film such as a low-k film. With regard to the surfactant used for such a purpose, a nonionic surfactant and an anionic surfactant are preferable.

The concentration of the surfactant is 0.0001 to 10 wt %, and particularly preferably 0.001 to 5 wt %. When the concentration of the surfactant is low, the ability to wet the low-k film is degraded, and when it is high, a concentration-dependent effect cannot be achieved.

EXAMPLES

The photoresist residue remover composition of the present invention is now explained in detail by reference to examples and comparative examples, but the present invention is not limited by these examples.

The photoresist residue remover compositions shown in Table 1 were prepared by using water as a solvent and the evaluation of photoresist residue removal performance, roughness of the copper surface, presence of side slit, and damage to the low-k film were carried out.

1) Photoresist Residue Remover Evaluation Test 1 (Copper/Low-k)

A silicon wafer was sequentially subjected to copper damascene wiring using Ta as a barrier metal and formation of an interlayer insulating film (low-k film), etc.; a resist was applied to the interlayer insulating film, exposed to light and developed, and via holes were formed by dry etching using the resist as a mask, the resist was then removed by ashing, and a photoresist residue was thus formed on the wafer. The wafer was subsequently immersed in the photoresist residue remover at 25° C. for 3 minutes, rinsed with running superpure water and dried, and the extent to which the photoresist residue was removed, corrosion of copper (roughness of the surface, presence of side slits), and damage to the low-k film were then evaluated using an electron microscope. The results are given in Table 1.

[Table 1]

TABLE 1

| | Photoresist residue remover composition (wt %) | | | Evaluation | | | |
|---|---|---|---|---|---|---|---|
| | photoresist residue removal component | Corrosion inhibitor | Water | Residue removal *2 | Cu surface roughness *3 | Side slitting *4 | Low-k film damage *5 |
| Com. Ex. 1 | TMAH *1 1 | — | 99 | A | C | C | D |
| Com. Ex. 2 | 2-(2-Aminoethoxy)ethanol 1 | — | 99 | A | C | C | D |
| Com. Ex. 3 | Oxalic acid 3.4 | — | 96.6 | C | B | B | A |
| Com. Ex. 4 | NH$_4$F 0.4 | — | 99.6 | A | C | C | A |
| Com. Ex. 5 | NH$_4$F 0.2 | — | 99.8 | A | C | C | A |
| Com. Ex. 6 | NH$_4$F 0.2 | D-Sorbitol 5 | 94.8 | A | C | C | A |
| Com. Ex. 7 | NH$_4$F 0.2 | Benzotriazole 1 | 98.8 | A | C | C | A |
| Com. Ex. 8 | NH$_4$F 0.2 | Mercapto-benzothiazole 1 | 98.8 | A | C | C | A |
| Ex. 1 | NH$_4$F 0.4 | Glyoxylic acid 0.03 | 99.57 | A | A | A | A |
| Ex. 2 | NH$_4$F 0.4 | Glyoxylic acid 0.05 | 99.55 | A | A | A | A |
| Ex. 3 | NH$_4$F 0.4 | Glyoxylic acid 0.1 | 99.5 | A | A | A | A |
| Ex. 4 | NH$_4$F 0.2 | Glyoxylic acid 0.05 | 99.75 | A | A | A | A |
| Ex. 5 | NH$_4$F 0.2 | Glyoxylic acid 0.1 | 99.7 | A | A | A | A |
| Ex. 6 | NH$_4$F 0.2 | Glyoxylic acid 0.15 | 99.65 | A | A | A | A |
| Ex. 7 | NH$_4$F 0.2 | Glyoxylic acid 0.2 | 99.6 | A | A | A | A |
| Ex. 8 | NH$_4$F 0.1 | Glyoxylic acid 0.05 | 99.85 | A | A | A | A |
| Ex. 9 | NH$_4$F 0.1 | Glyoxylic acid 0.2 | 99.7 | A | A | A | A |
| Ex. 10 | NH$_4$F 0.1 | Glyoxylic acid 0.3 | 99.6 | A | A | A | A |
| Ex. 11 | NH$_4$F 0.2 | Ascorbic acid 0.1 | 99.7 | A | A | A | A |
| Ex. 12 | NH$_4$F 0.2 | Glucose 0.1 | 99.7 | A | A | A | A |
| Ex. 13 | NH$_4$F 0.2 | Fructose 0.1 | 99.7 | A | A | A | A |
| Ex. 14 | NH$_4$F 0.2 | Lactose 1.0 | 98.8 | A | A | A | A |
| Ex. 15 | NH$_4$F 0.2 | Mannose 5.0 | 94.8 | A | A | A | A |

*1 Tetramethylammonium hydroxide
*2 Residue removal; A: very good, B: good, C: some residue remained, D: impossible to remove.
*3 Cu surface roughness; A: none, B: slight, C: surface etched.
*4 Side slitting; A: none, B: slight, C: side slitting.
*5 Low-k film damage; A: no damage, B: slightly rough surface, C: rough surface, D: film thickness decreased.

Effects of the Invention

The photoresist residue remover composition of the present invention has excellent properties for removing the photoresist residue remaining after dry etching in a production process for a semiconductor circuit device without corroding a wiring material or damaging a barrier metal layer, an interlayer insulating film, etc.

What is claimed is:

1. A photoresist residue remover composition consisting essentially of:

a fluoride compound;
a corrosion inhibitor for copper and aluminum selected from the group consisting of glyoxylic acid, ascorbic acid, glucose, fructose, lactose, and mannose; and
water.

2. The photoresist residue remover composition according to claim 1 wherein the fluoride compound is ammonium fluoride.

3. The photoresist residue remover composition of claim 1 wherein the concentration of glyoxylic acid, ascorbic acid, glucose, fructose, lactose, and mannose used is 0.01 to 5.0 wt % of the entire composition.

4. A photoresist residue remover composition consisting essentially of:

a fluoride compound;

a corrosion inhibitor for copper and aluminum selected from the group consisting of glyoxylic acid, ascorbic acid, glucose, fructose, lactose, and mannose;

water; and a surfactant.

5. The photoresist residue remover composition of claim 1 wherein it is used for a substrate having one type or two or more types chosen from the group consisting of copper, a copper alloy, and a low permittivity (low-k) film.

6. A method for removing a photoresist residue and a sidewall polymer remaining after dry etching and after ashing of interlayer insulating film material, a wiring material, a capacitor or an electrode material of a semiconductor circuit device comprising immersing the interlayer insulating film material, the wiring material, the capacitor or the electrode material of the semiconductor circuit device in the photoresist residue remover composition according to any one of claims 1 to 5.

* * * * *